(12) United States Patent
Truong et al.

(10) Patent No.: US 7,732,810 B2
(45) Date of Patent: Jun. 8, 2010

(54) METHODS FOR FORMING AN UNDERCUT REGION AND ELECTRONIC DEVICES INCORPORATING THE SAME

(75) Inventors: Nugent Truong, Ventura, CA (US); Charles Douglas Macpherson, Santa Barbara, CA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 33 days.

(21) Appl. No.: 11/840,392

(22) Filed: Aug. 17, 2007

(65) Prior Publication Data

US 2008/0210931 A1    Sep. 4, 2008

Related U.S. Application Data

(63) Continuation of application No. 10/915,578, filed on Aug. 10, 2004, now Pat. No. 7,276,453.

(51) Int. Cl.
*H01L 51/50* (2006.01)
(52) U.S. Cl. ................... 257/40; 257/E51.018
(58) Field of Classification Search ................... 257/40, 257/E51.018
See application file for complete search history.

(56) References Cited

U.S. PATENT DOCUMENTS

| | | | |
|---|---|---|---|
| 4,705,592 A | 11/1987 | Bahrie | |
| 4,735,676 A | 4/1988 | Iwasa | |
| 4,784,721 A | 11/1988 | Holmen et al. | |
| 4,914,742 A | 4/1990 | Higashi et al. | |
| 5,133,036 A | 7/1992 | Tornqvist | |
| 5,158,645 A | 10/1992 | Covert et al. | |
| 5,244,817 A | 9/1993 | Hawkins et al. | |
| 5,284,548 A | 2/1994 | Carey et al. | |
| 5,364,742 A | 11/1994 | Fan et al. | |
| 5,441,139 A | 8/1995 | Abe et al. | |
| 5,532,174 A | 7/1996 | Corrigan | |
| 5,559,345 A | 9/1996 | Kim | |
| 5,616,514 A | 4/1997 | Muchow et al. | |
| 5,701,055 A | 12/1997 | Nagayama et al. | |
| 6,013,538 A * | 1/2000 | Burrows et al. | ............... 438/22 |
| 6,169,357 B1 | 1/2001 | Potter | |
| 6,383,327 B1 | 5/2002 | Mase | |
| 6,465,286 B2 | 10/2002 | Possin et al. | |
| 6,547,973 B2 | 4/2003 | Field | |
| 7,151,342 B2 * | 12/2006 | Sellars et al. | ............... 313/509 |
| 2002/0081847 A1 | 6/2002 | Jo et al. | |

(Continued)

FOREIGN PATENT DOCUMENTS

EP    0 445 881 A1    9/1991

(Continued)

*Primary Examiner*—Trung Dang (57) ABSTRACT

An electronic device having a substrate structure having an undercut region is provided and further included is a method for forming an undercut region of a substrate structure. The method includes forming a patterned protective layer over a first electrode. The method also includes forming the substrate structure over the patterned protective layer. An opening within the substrate structure overlies an exposed portion of the substrate structure. The method further includes removing the exposed portion of the patterned protective layer, thereby exposing a portion of the first electrode and forming an undercut region of the substrate structure. The method still further includes depositing a liquid over the first electrode after removing the exposed portion of the patterned protective layer, and solidifying the liquid to form a solid layer.

8 Claims, 4 Drawing Sheets

U.S. PATENT DOCUMENTS

| | | |
|---|---|---|
| 2002/0127844 A1 | 9/2002 | Grill et al. |
| 2003/0010745 A1 | 1/2003 | Field |
| 2003/0010746 A1 | 1/2003 | Gutierrez et al. |
| 2004/0101988 A1* | 5/2004 | Roman et al. ................. 438/40 |
| 2004/0207316 A1 | 10/2004 | Birnstock et al. |
| 2005/0052120 A1 | 3/2005 | Gupta et al. |

FOREIGN PATENT DOCUMENTS

| | | |
|---|---|---|
| WO | WO 00/48236 A1 | 8/2000 |

* cited by examiner

METHODS FOR FORMING AN UNDERCUT REGION AND ELECTRONIC DEVICES INCORPORATING THE SAME

STATEMENT AS TO FEDERALLY SPONSORED RESEARCH

This invention was made with Government support under DARPA grant number 4332. The Government may have certain rights in the invention.

BACKGROUND OF THE INVENTION

1. Field of the Invention

The invention relates generally to methods for producing electronic devices, and more specifically, to methods for producing undercut regions in substrate structures.

2. Description of the Related Art

Organic electronic devices have attracted increasing attention in recent years. Examples of organic electronic device include Organic Light-Emitting Diode ("OLED") displays. Organic active layers can be deposited over a substrate using ink-jet printing. A substrate structure is typically formed as a physical barrier to confine the red, green, and blue materials to separate pixels or subpixels. These substrate structures are often formed using an organic material such as a positive or negative photoresist material. However, when developers are introduced to pattern the photoresist material, Galvanic coupling reactions can occur with the underlying electrode resulting in a damaged pixel or subpixel. Often an insulation process using a dielectric material is used to protect the underlying electrode during patterning of the substrate structure, but this process is time consuming. In addition, the dielectric material must be completely removed before the organic layers are deposited, otherwise the pixel or subpixel will not function. This removal of the dielectric material is typically performed using a Reactive Ion Etch (RIE) which can easily damage the underlying electrode if not stopped precisely when all of the dielectric material has been removed.

In order to form an active layer with a uniform thickness within each pixel or subpixel, accurate deposition of the ink and proper design and treatment of the substrate structures is generally required. However, surface treatments of the substrate structures, such as plasma treatment, can easily damage the underlying electronic components in, for instance, an active matrix substrate. It has proven quite challenging to develop manufacturing processes for organic electronic devices that maintain peak device performance while using surface treatment for substrate structures and at the same time providing uniform deposition of organic materials into the pixels or subpixels.

SUMMARY OF THE INVENTION

In one embodiment, a method is used for forming a solid layer within an undercut region of a substrate structure. The method includes forming a patterned protective layer over a first electrode. The method also includes forming the substrate structure over the patterned protective layer. An opening within the substrate structure overlies an exposed portion of the patterned protective layer. The method further includes removing the exposed portion of the patterned protective layer, thereby exposing a portion of the first electrode and forming an undercut region of the substrate structure. The method still further includes depositing a liquid over the first electrode after removing the exposed portion of the patterned protective layer, and solidifying the liquid to form a solid layer within the undercut region of the substrate structure.

In another embodiment, an electronic device includes a substrate and a first electrode over the substrate. The electronic device also includes a substrate structure having an undercut region. At least a portion of the undercut region overlies the first electrode. The undercut region has a height of 0.1 microns to 1 micron and a depth of 0.1 microns to 10 microns. The electronic device further includes at least one organic layer over the first electrode and a second electrode over the at least one organic layer. The electronic device includes an organic electronic component, wherein the organic electronic component includes the first electrode, the at least one organic layer, and the second electrode.

The foregoing general description and the following detailed description are exemplary and explanatory only and are not restrictive of the invention, as defined in the appended claims.

BRIEF DESCRIPTION OF THE FIGURES

The invention is illustrated by way of example and not limitation in the accompanying figures, in which the same reference number indicates similar elements in the different figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

In one embodiment, a method is used for forming a solid layer within an undercut region of a substrate structure. The method includes forming a patterned protective layer over a first electrode. The method also includes forming the substrate structure over the patterned protective layer. An opening within the substrate structure overlies an exposed portion of the patterned protective layer. The method further includes removing the exposed portion of the patterned protective layer, thereby exposing a portion of the first electrode and forming an undercut region of the substrate structure. The method still further includes depositing a liquid over the first electrode after removing the exposed portion of the patterned protective layer, and solidifying the liquid to form a solid layer within the undercut region of the substrate structure.

In another embodiment, the method further includes applying a surface treatment to the substrate structure prior to removal of the patterned protective layer. In still a more specific embodiment, the surface treatment comprises fluorination. In another specific embodiment, depositing the liquid is performed using a precision deposition technique. In a further specific embodiment, another portion of the patterned protective layer remains over the substrate after removing the exposed portion of the patterned protective layer. In yet a further specific embodiment, the solid layer includes an organic active layer.

In one embodiment, an electronic device includes a substrate and a first electrode over the substrate. The electronic device also includes a substrate structure having an undercut region. At least a portion of the undercut region overlies the first electrode. The undercut region has a height of 0.1 microns to 1 micron and a depth of 0.1 microns to 10 microns. The electronic device further includes at least one organic layer over the first electrode and a second electrode over the at least one organic layer. The electronic device includes an organic electronic component, wherein the organic electronic component includes the first electrode, the at least one organic layer, and the second electrode.

In another embodiment, the at least one organic layer includes an organic active layer.

Many specific embodiments for the method or electronic device described herein can be used. The following specific details are merely illustrative and not limiting. In one embodiment, the patterned protective layer includes at least one element within Group 4, 5, 6, 8 10, 11, 12, 13 or 14 of the Periodic Table, or any combination thereof. In another embodiment, the patterned protective layer includes at least one element including Cu, Al, Ag, Au, Mo, Cr, Ti, Ta, W, Si, or any combination thereof. In still another embodiment, the patterned protective layer includes a first metallic layer and a second metallic layer, wherein the first metallic layer contacts both the first electrode and the second metallic layer. In a more specific embodiment, the first metallic layer includes at least one element including Mo, Cr, Ti, Ru, Ta, W, Si, or any combination thereof. In another specific embodiment, the second metallic layer comprises at least one element comprising Cu, Al, Ag, Au, Mo, or any combination thereof. In still other embodiments, the patterned protective layer can include a silicon-containing molecule or an organic material. In one embodiment, the undercut region has a height of 0.1 microns to 1 micron and a depth of 0.1 microns to 10 microns. In another embodiment, the undercut region has a height of 0.4 microns to 1 micron and a depth of 0.5 microns to 10 microns.

Other features and advantages of the invention will be apparent from the following detailed description, and from the claims.

Before addressing details of embodiments described below, some terms are defined or clarified. As used herein, the term "active", when referring to a layer or material, is intended to mean a layer or material that exhibits electronic properties, electro-radiative properties, or a combination thereof. An active layer material may emit radiation or exhibit a change in concentration of electron-hole pairs when receiving radiation.

The term "electrode" is intended to mean a structure configured to transport carriers. For example, an electrode may be an anode, a cathode, a capacitor electrode, a gate electrode, etc. Electrodes may include parts of transistors, capacitors, resistors, inductors, diodes, organic electronic components and power supplies.

The term "electronic component" is intended to mean a lowest level unit of a circuit that performs an electrical or electro-radiative (e.g., electro-optic) function. An electronic component may include a transistor, a diode, a resistor, a capacitor, an inductor, a semiconductor laser, an optical switch, or the like. An electronic component does not include parasitic resistance (e.g., resistance of a wire) or parasitic capacitance (e.g., capacitive coupling between two conductors connected to different electronic components where a capacitor between the conductors is unintended or incidental).

The term "electronic device" is intended to mean a collection of circuits, electronic components, or combinations thereof that collectively, when properly connected and supplied with the appropriate potential(s), performs a function. An electronic device may include or be part of a system. Examples of electronic devices include displays, sensor arrays, computer systems, avionics, automobiles, cellular phones, and many other consumer and industrial electronic products.

The term "fluorination" refers to a surface treatment process by which fluorine becomes associated with a surface of a substrate or layer.

The term "organic electronic device" is intended to mean a device including one or more organic semiconductor layers or materials. Organic electronic devices include: (1) devices that convert electrical energy into radiation (e.g., a light-emitting diode, light emitting diode display, diode laser, or lighting panel), (2) devices that detect signals through electronic processes (e.g., photodetectors, photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode).

The term "metallic," when referring to a layer, member, or structure, is intended to mean that such layer, member, or structure is conductive and includes one or more the elements within Groups 3-14 of the Periodic Table.

The term "precision deposition technique" is intended to mean a deposition technique that is capable of depositing one or more materials over a substrate at a dimension, as seen from a plan of the substrate, no greater than approximately one millimeter. A stencil mask, frame, substrate structure, patterned layer or other structure(s) may be present during such deposition. Examples of precision deposition techniques include ink-jet printing and continuous printing using a nozzle less than a millimeter in width (e.g., diameter).

The term "solidifying" is intended to mean a process of converting a liquid to a solid. Examples of solidification include (1) evaporating a carrier liquid medium, (2) crosslinking or polymerizing a material within a liquid, (3) curing a material, or (4) freezing the liquid.

The term "substrate" is intended to mean a workpiece that can be either rigid or flexible and may be include one or more layers of one or more materials, which can include, but are not limited to, glass, polymer, metal or ceramic materials or combinations thereof.

The term "substrate structure" is intended to mean a structure used to divide a substrate into different areas as seen a plan view of the substrate. An example of a substrate structure includes a dam, divider, frame, or well structure.

The term "surface treatment" refers to a process used to modify the properties of a surface. Surface treatments can include chemical etching, electrochemical reduction, atmospheric pressure discharge (for example corona discharge), plasma etching, ion beam bombardment, electron beam bombardment, laser ablation, metal induced crystallization, and photochemical modification.

The term "undercut region" is intended to mean to, during at least one point in time during a process sequence, an open area of space that underlies and separates a substrate structure from an underlying layer or a portion of a substrate.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{St}$ Edition (2000).

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductor arts.

Patterned protective layer(s) can be formed over at least part of electrode(s) or other sensitive portion(s) of a substrate during the formation of an electronic device. The patterned protective layer(s) may be used during the formation or treatment of structures after the electrode(s) or other sensitive portion(s) have been formed. After performing the formation or treatment processes, at least part of the patterned protective layer can be removed, and formation of the electronic device can be completed.

Substrates contemplated for the embodiments can be flexible or rigid, organic or inorganic. Generally, glass or organic films in either rigid or flexible form are used as a substrate.

In one embodiment example, a first electrode is formed over a substrate. The first electrode is an anode and is more efficient for injecting holes into the device layers compared to a subsequently formed cathode. The first electrode can include materials containing a metal, metal alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements.

If the first electrode is to be light transmitting in the visible spectral range, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for the first electrode include indium-tin-oxide ("ITO"), aluminum-tin-oxide, gold, silver, copper, and nickel. The anode may also comprise an organic material, such as a conducting polyaniline ("PANI").

The first electrodes may be formed by a conventional chemical or physical vapor deposition process or by a conventional solution-coating process. The first electrodes can be patterned as deposited by using a stencil mask (e.g., a shadow mask). Alternatively, the layer(s) for the first electrodes can be blanket deposited and patterned using a conventional lithographic process. When the electronic device includes a passive matrix array, the first electrodes are typically substantially parallel strips having lengths that extend in substantially the same direction. In an active matrix array, the first electrodes are discrete electrode for each pixel or subpixel.

After formation of the first electrodes, a patterned protective layer is formed overlying the first electrode. The patterned protective layer helps to protect the first electrodes while forming a subsequent substrate structure. The patterned protective layer can have one or more of a wide variety of materials. The actual material(s) used for the patterned protective layer depends in part on the material(s) used for the first electrode, and chemical(s) or other material(s) to which the first electrodes would otherwise be exposed. Also, the patterned protective layer will be removed selectively to the first electrodes and the substrate structure.

In one embodiment, if the first electrodes include any one or a combination of materials previously described for the first electrode and the substrate structure includes photoresist, the patterned protective layer can include one or more metallic layers. In another embodiment, one or more silicon-containing materials or molecules (e.g., amorphous silicon, silicon dioxide, silicon nitride, silicon carbide, etc.) can be used. In still another embodiment, if the substrate structure includes an inorganic material, such as silicon dioxide or silicon nitride, the patterned protective layer may include an organic layer.

In certain embodiments, the patterned protective layer includes a first metallic layer and a second metallic layer. In one embodiment, the first metallic layer is in contact with both one of the first electrodes and the second metallic layer. The first metallic layer can provide better adhesion to the first electrode than the second metallic layer would if used alone.

The patterned protective layer can include at least one element selected from Groups 4-6, 8 and 10-14 of the Periodic Table, and mixtures thereof. In some embodiments, the patterned protective layer can include at least one element including Cu, Al, Ag, Au, Mo, or any combination thereof. In one specific embodiment, the patterned protective layer includes Cu.

In some embodiments, where the patterned protective layer includes a first metallic layer and a second metallic layer, the first metallic layer can include at least one element including Mo, Cr, Ti, Ru, Ta, W, Si, or any combination thereof. In one specific embodiment, the first metallic layer includes Mo.

In one set of embodiments, formation of the patterned protective layer is achieved by any of the methods previously described with respect to the first electrodes. The first electrodes and patterned protective layer can be formed using the same or different methods. If the patterned protective layer includes a silicon-containing material, such silicon-containing material may be formed using a conventional physical vapor or chemical vapor deposition technique. Such deposition may or may not be plasma assisted. If the protective layer includes an organic material, the protective layer may be formed using a conventional lithographic technique. After reading this specification, skilled artisans will appreciate that the formation of the patterned protective layer can depend on the materials used and the materials already present over the substrate before the patterned protective layer is formed.

The thickness of the patterned protective layer is sufficiently large to substantially prevent damage to underlying portion(s) (e.g., first electrodes) of the electronic device. Although no theoretical upper limit on the thickness is known, practical considerations, such as equipment throughput or process complexities (etchant used to remove at least a portion of the patterned protective layer being exposed too long to the first electrodes) may limit the thickness. In one embodiment, the thickness of the patterned protective layer is in a range of 0.1 to 1 micron. In another embodiment, the patterned protective layer is at least 0.4 microns. In an embodiment where the patterned protective layer includes at least two layers, the first layer may act as an adhesion layer and have a thickness in a range of approximately 10-100 nm. The second layer makes up the rest of the thickness of the patterned protective layer.

Figure 1:
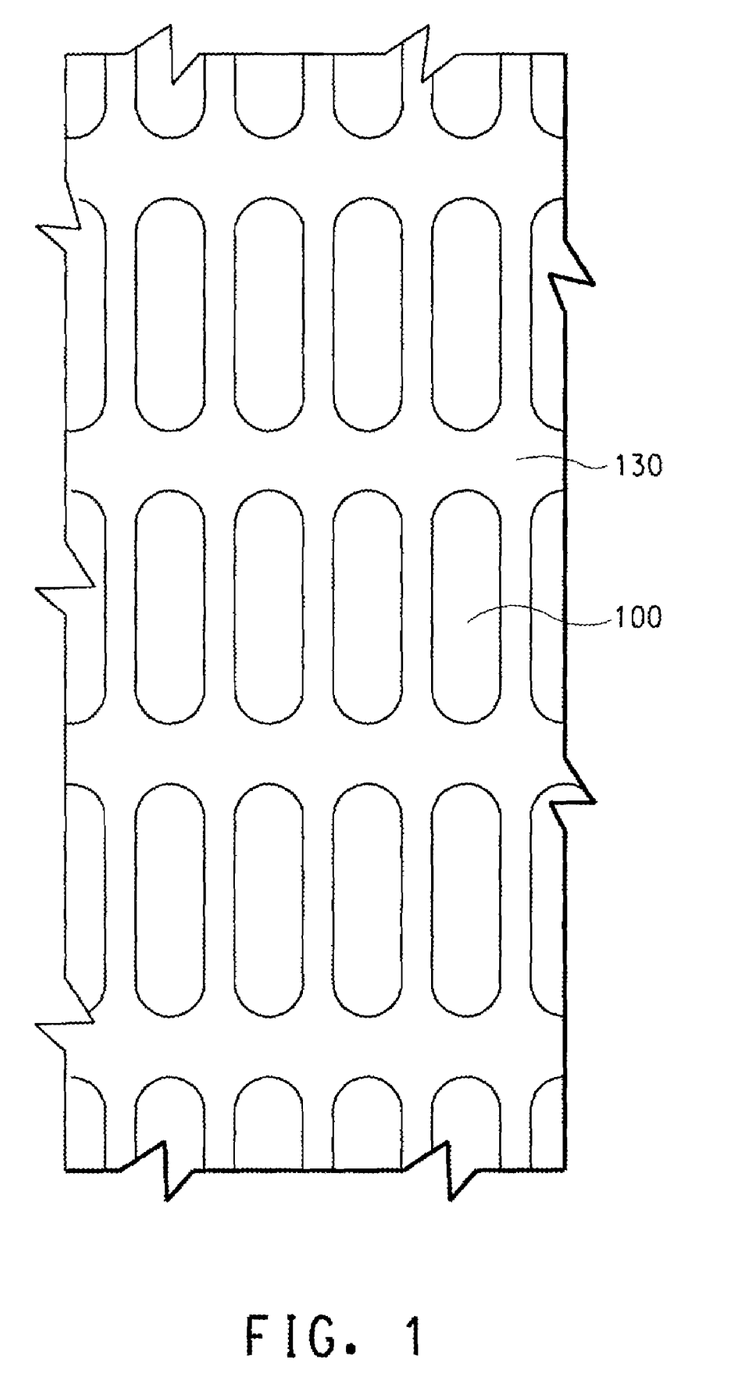
FIG. 1 includes a plan view of an array of pixels (or subpixels) surrounded by a substrate structure.

Referring to FIG. 1, after forming the patterned protective layer, a substrate structure 130 is formed over the patterned protective layer to create discrete openings, which are also called wells. The substrate structure may also be referred to as a "well structure." The openings may have any desired shape, for example, rectangular, circular (including oval-shaped), triangular, and the like. The embodiment illustrated in FIG. 1 includes "pill"-shaped pixels 100 that form an array in an organic electronic device. In another embodiment, the openings may correspond to subpixels. In the plan view of FIG. 1, exposed portions of the patterned protective layer can be seen and substantially correspond to the pixels 100. In one embodiment, the substrate structure 130 includes an organic material, such as a positive or negative photoresist material, an epoxy resin, acrylic resin, polyimide resin, and the like, or the substrate structure 130 may be an inorganic material, such as glass. In another embodiment, the substrate structure 130 can include any combination of organic materials, inorganic materials, or organic and inorganic materials.

Figure 2A:
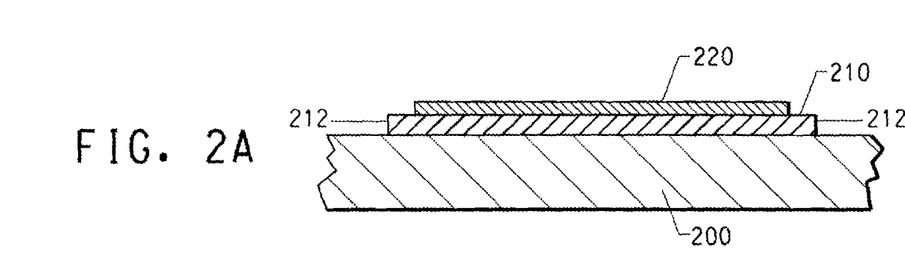
FIGS. 2A-2C include illustrations of cross-sectional views of an individual subpixel in an electronic device having undercut regions.

As depicted in FIG. 2A, a first electrode 210 is formed over a substrate 200. Although not shown in FIG. 2, other first electrodes similar to first electrode 210 are formed over the substrate 200. No, one, or more than one intervening layers may lie between the substrate 200 and the first electrode 210. In this illustrative embodiment, a patterned protective layer 220 is formed over the first electrode 210, followed by the substrate structure 130 (FIG. 2B), which is formed such that a portion of the substrate structure 130 overlies the patterned protective layer 220. The profile of the substrate structure 130 may take on a variety of shapes as long as it is able to form an undercut region 240 (FIG. 2C) into which subsequently deposited organic layers can form. For the sake of convenience, only one profile is shown in the figures. The formation of and materials that can be used for the first electrode 210, patterned protective layer 220, and substrate structure 130 have been previously described.

Figure 2B:
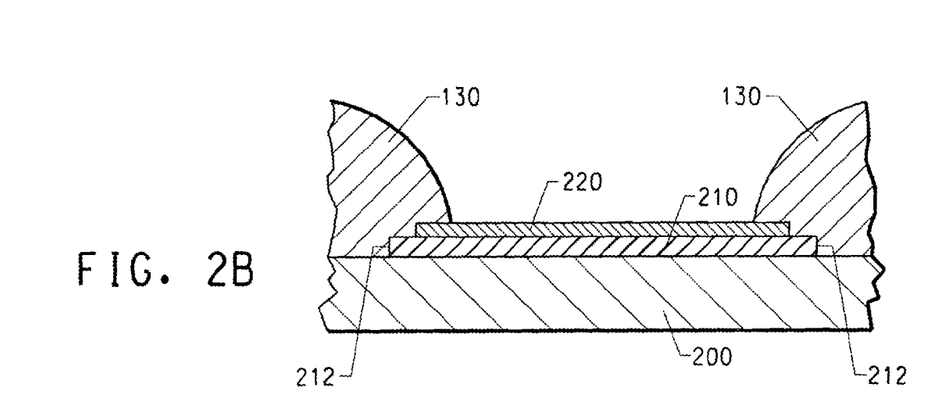

In one embodiment, after formation of the substrate structure 130, a surface treatment is performed. Depending on the materials used for the patterned protective layer 220, the surface treatment may be performed before, during, or after removal of the patterned protective layer 220. A surface treatment such as fluorination with fluorine-containing plasma can be performed to modify the surface properties of the substrate structure 130, and can improve the uniformity of subsequently deposited organic layers. The patterned protective layer 220 may significantly reduce the likelihood of damage to the underlying electronic components in an active matrix organic electronic device from the fluorine plasma.

In one embodiment, the fluorine-containing plasma is generated from one or more fluorine-containing feed gases. When a fluorine-containing gas is used, it may include any one or more fluorocarbon gases, which may or may not be saturated and may or may not include other halogen atoms, $F_2$, HF, $SF_6$, $NF_3$, metal fluorides ($WF_6$, $MoF_6$, $TaF_5$), fluorine-containing interhalogens (ClF, $ClF_3$, $ClF_5$, $BrF_3$, $BrF_5$, and $IF_5$), and mixtures thereof. In still another embodiment, the fluorocarbon may have a formula $C_aF_bH_c$, wherein a is 1 or 2, b is at least one, and b+c is 4 if a is 1 and is 4 or 6 if a is 2. $CF_4$ is an exemplary fluorocarbon gas.

One or more inert gases, one or more oxidizing gases, or any combination thereof may be used as feed gases. The inert gas may include any one or more of a noble gas, $N_2$, and mixtures thereof. The oxidizing gas may include any one or more of molecular oxygen, ozone, nitrous oxide, and mixtures thereof.

In one embodiment, gases used during fluorination may consist essentially of a mixture of $O_2$, $CF_4$, and Ar. The fluorination may be performed at a power density in a range of approximately 10 to 5000 mW/cm$^2$ and at a pressure in a range of approximately 7.5 to 5000 mTorr. The temperature can vary, depending on the performance sensitive element and the organic material to be removed. The dry etch is typically performed at a temperature not above about 80° C.

Figure 2C:
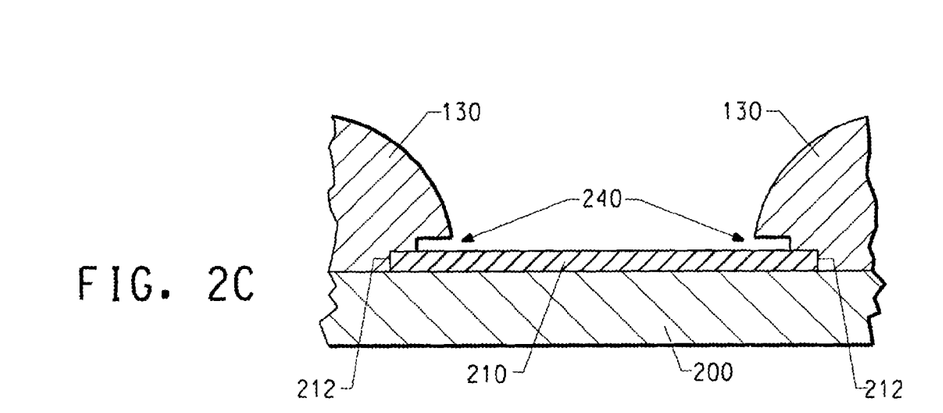

After forming the substrate structures 130 and performing the optional surface treatment, the exposed portion of the patterned protective layer 220 can be subsequently removed. The undercut region 240 can be formed as the exposed portion of the patterned protective layer 220 is removed or can be formed during an extended etching procedure to remove an additional portion of the patterned protective layer 220. The undercut region 240 is defined by the open area that lies underneath the substrate structure 130 and between the substrate structure 130 and the first electrode 210.

The method for removing the patterned protective layer 220 depends on the materials of the patterned protective layer 220, the first electrode 210, and the substrate structure 130. The patterned protective layer 220 is to be removed selectively to the first electrode 210 and the substrate structure 130. If the patterned protective layer includes one or more metallic layers, wet chemistry techniques (such as etching with acetic acid mixed with water and hydrogen peroxide) can be used. If the patterned protective layer 220 includes a silicon-containing material, a fluorine-containing plasma may be used. In one embodiment, the feed gas(es) for the plasma include any of the gases and conditions previously described for the surface treatment. In one specific embodiment, the surface treatment and patterned protective layer removal can be performed simultaneously during at least one point in time. In another specific embodiment, the feed gas(es) does not include hydrogen in order to increase the isotropic character of the etch. If the patterned protective layer 220 includes an organic layer, an oxygen-containing plasma may be used. Feed gases can include $O_2$, $O_3$, $N_2O$, or any combination thereof. In one embodiment, the conditions described with respect to the surface treatment (e.g., pressure, power density, etc.) can be used for removing the organic layer. In one specific embodiment, a downstream plasma with a remote plasma chamber can generate uncharged species that can enter an etching chamber to remove the patterned protective layer 220. Such a downstream plasma typically etches isotropically and produces less plasma damage as the plasma is generated in a separate remote chamber.

Because the patterned protective layer 220 is removed after the surface treatment, the surfaces of the substrate structure 130 along the undercut region 240 are not fluorinated.

Accordingly, the substrate structure 130 is formed wherein the wall outside the undercut region 240 has been subject to surface treatment, but the portion of the substrate structure 130 along the undercut region 240 has not. This can result in improved wetting characteristics of a liquid when deposited into the openings within the substrate structure 130. For example, when an organic layer is deposited as a liquid composition from an ink-jet or continuous printing nozzle into an opening of the substrate structure 130 in forming a pixel 100, or subpixel, the non-fluorinated portion of the substrate structure 130 and undercut region 240, aid in the spreading of the liquid to allow the liquid composition to coat the active area more uniformly. Uniform coating of active layers results in electronic devices having improved performance homogeneity across an array of pixels 100 or subpixels.

The dimensions of the undercut region 240 are determined by the thickness of the patterned protective layer 220. In some embodiments, the undercut region 240 has a height of about 0.1 microns to about 1 micron and a depth of about 0.1 microns to about 10 microns. In other embodiments, the undercut region 240 has a height of about 0.4 microns to about 1 microns and a depth of about 0.5 microns up to about 10 microns. After formation of the undercut region 240, the substrate structure 130 is ready to receive an organic layer.

In another embodiment (not shown), the patterned protective layer 220 may have a different shape. For example, the first electrode 210 and patterned protective layer 220 may have sides that are coterminous. In other words, the sides of the patterned protective layer 220 extend to but not along sidewalls 212 of the first electrode 210. Such a structure can be formed by using the same stencil mask when depositing the layers for the first electrode 210 and the patterned protective layer 220. In another embodiment, all of the layers for the first electrode 210 and patterned protective layer 220 may be blanket deposited. A resist mask can be used for etching all of the layers for the first electrode 210 and patterned protective layer 220.

Figure 3A:
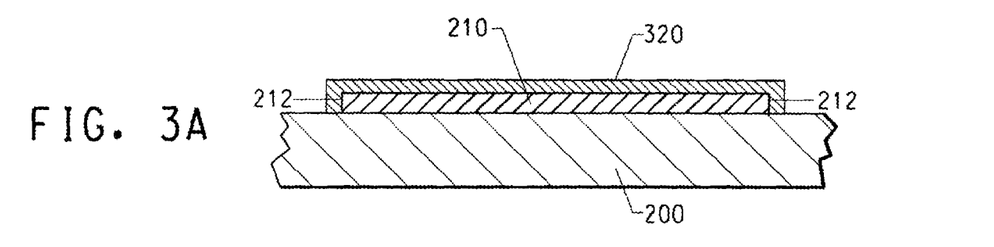
FIGS. 3A-3C include illustrations of cross-sectional views of an individual subpixel in an electronic device having a portion of a patterned protective layer that remain after a substantial portion of the patterned protective layer is removed.
Figure 3B:
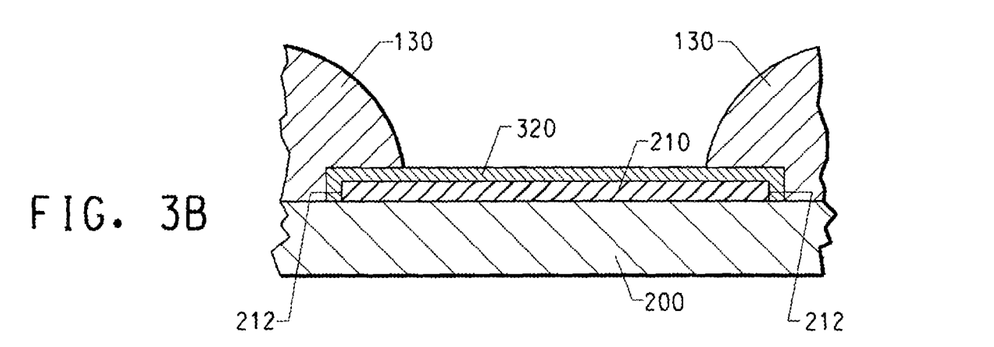
Figure 3C:
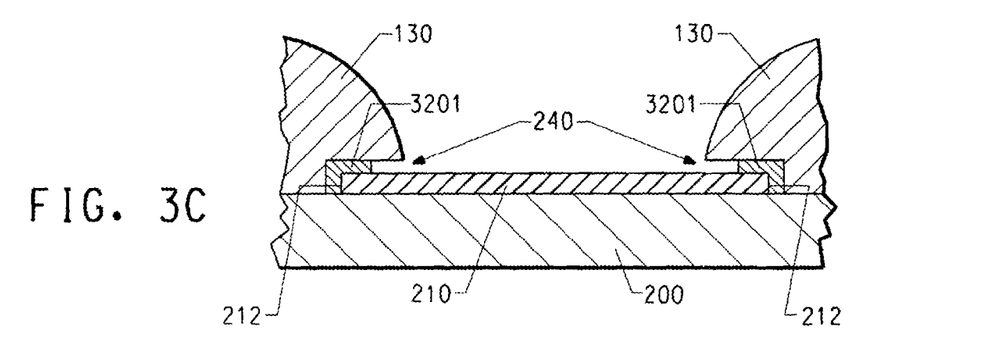

In still another embodiment as illustrated in FIGS. 3A-3C, the patterned protective layer 320 can extend along the sidewalls 212 of the first electrode 210 and may or may not contact the substrate 200. Although not shown, the patterned protective layer 320 can be extended over the substrate 200 even further from the sidewalls 212 of the first electrode 210. The edges of the patterned protective layer 320 should not be so large as to significantly increase the risk of an electrical short or leakage path or result in unacceptable parasitic capacitance to another part (e.g., an adjacent first electrode) of the electronic device.

After the substrate structure 130 and undercut region 240 are formed (FIGS. 3B and 3B), a residual portion 3201 of the patterned protective layer 320 remains. In one embodiment, the residual portion 3201 is thicker than the first electrode 210 and has a substantially lower bulk resistivity and sheet resistance compared to the first electrode 210. As such, the residual portion 3201 can allow less voltage drop along a column of pixels connected to the first electrode 210, generate less heat (due to less resistive heating), and increase heat dissipation due to more material having a relatively higher thermal conductivity as compared to the first electrode 210.

After the formation of undercut regions 240 using any of the techniques in the previously described embodiments, one or more liquid layers may be formed. In one embodiment, an organic layer may be formed over the first electrode 210, and may include one or more layers. The layers can include an organic active layer and any one or more of a buffer layer, a hole-injection layer, a hole-transport layer, an electron-blocking layer, a hole-blocking layer, an electron-transport layer, or an electron-injection layer. At least one of the layers is formed by depositing a liquid. In one embodiment, all of the organic layers are deposited as liquids. In another embodiment, one or some of the organic layers may be vapor deposited.

Figure 4:
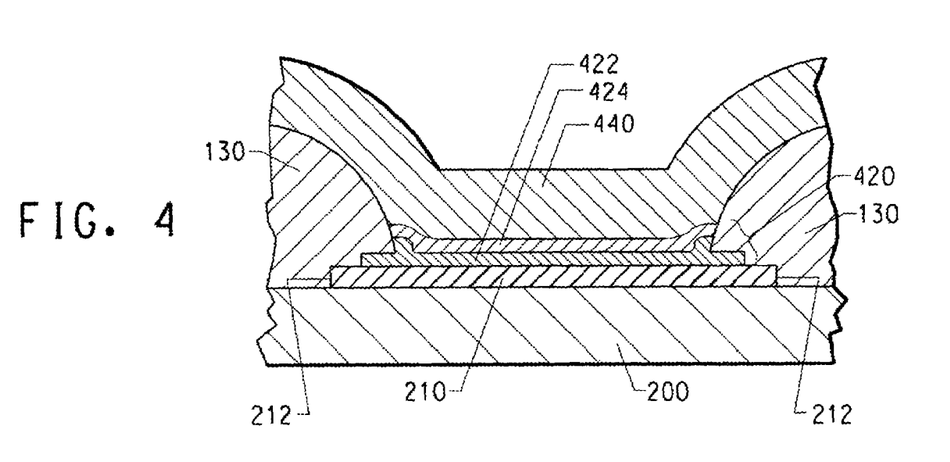
FIG. 4 includes an illustration of a cross-sectional view of the electronic device in FIG. 2C after forming an organic layer and a second electrode.

In one embodiment, the substrate 200, first electrode 210, and substrate structure 130 as illustrated in FIG. 2C can be a starting point for forming the organic layers. As illustrated in FIG. 4, an organic layer 420 is formed over the first electrode 210, within the undercut region 240, and between the walls of the substrate structure 130. In this specific embodiment, the organic layer 420 includes a hole-transport layer 422 and an organic active layer 424. The materials for the hole-transport layer 422 and organic active layer 424 are conventional. Each of the hole-transport layer 422 and the organic active layer 424 is formed by depositing a liquid using a precision deposition technique. In one embodiment, the precision deposition technique can be ink-jet printing, continuous printing, or the like. When continuous printing is used, the nozzle for dispensing the liquid is no greater than one millimeter in diameter. In another embodiment, the nozzle is no greater than 100 microns, and in still another embodiment, the nozzle is no greater than 20 microns.

The liquid(s) used for the organic layer 420 may be deposited in the form of a liquid composition, such as a suspension, a dispersion, an emulsion, or a solution. After depositing the liquid(s), it is solidified. Solidification can include (1) evaporating a carrier liquid medium, (2) cross-linking or polymerizing a material within a liquid, (3) curing a material, or (4) freezing the liquid. In one specific embodiment, a carrier liquid medium within the liquid composition is evaporated using a conventional technique. Solidification may occur after each liquid is deposited or after any plurality of liquids are deposited. Although not shown in FIG. 4, portions of both the organic active layer 424 and hole-transport layer 422 may lie within the undercut regions 240.

A second electrode 440 can then be formed over the organic layer 420 as illustrated in FIG. 4. In this illustrative example, the second electrode can be a cathode. For a passive matrix array, the second electrodes 440 may be patterned into substantially parallel strips, where the lengths of the second electrodes 440 extend in substantially the same direction and substantially perpendicular to the lengths of the first electrodes 210. In an active matrix array, this second electrode 440 can act as a common cathode for the array. The second electrode 440 can include one or more layers. The materials, thicknesses, and formation process(es) for the second electrode 440 are conventional.

Other circuitry may be formed to complete the electronic device. Such circuitry may include row or column decoders, strobes (e.g., row array strobe, column array strobe), or sense amplifiers. Alternatively, such circuitry may be formed before, during, or after the formation of any of the previously described layers.

A lid with a desiccant can be attached to the substrate at locations outside the array to form a substantially completed device. The materials used for the lid and desiccant and the attaching process are conventional.

The methods described herein are useful for forming electronic devices that include radiation-emitting or radiation-responsive electronic components. In one embodiment, the radiation-emitting electronic components can include a passive array or an active array of organic OLEDs. In another embodiment, the radiation-responsive electronic components can include sensors, detectors, photovoltaic cells, or combinations thereof. In another embodiment, an electronic device can include a combination of radiation-emitting and radiation-responsive electronic components. After reading this specification, skilled artisans will appreciate that the scope of the invention is not limited to methods including the formation of organic active layers. The methods may be useful for any liquid deposition process that includes deposition of the liquid into any relatively small openings or spaces (e.g., less than one millimeter in their smallest dimensions as seen from a plan view).

The use of a patterned protective layer 220 during production of electronic devices to form undercut regions 240 provides several advantages. In particular, the patterned protective layer 220 substantially prevents damage to an underlying layer that is exposed during subsequent processing of the substrate structure 130. For example, the patterned protective layer 220 can protect the first electrode 210 from Galvanic reactions that can occur when a developer is introduced during formation of the substrate structure 130.

In addition, since the patterned protective layer 220 can be removed before or after any surface treatment of the substrate structure 130, the undercut region 240 may or may not be subjected to surface treatment (such as, e.g., fluorination). Accordingly, substrate structure 130 can be formed wherein the walls have been subject to surface treatment, but the undercut regions 240 have not. This provides broader process latitude when considering the wetting characteristics of an organic layer deposited from solution into a well.

EXAMPLES

The following specific examples are meant to illustrate and not limit the scope of the invention.

Example 1

Example 1 demonstrates that an undercut region of a substrate structure can be formed.

An ITO coated glass substrate 200 (nominally 30×30 mm) is patterned and etched using conventional photolithography techniques to form 120 micron wide first electrodes 210 shaped as columns with 20 micron spacings between pairs of first electrodes. A 500 nm thick Cu metallic layer is then sputter deposited onto the first electrode. A patterned masking layer including a resist material (e.g., AZ-9220™, Clariant Corp., Somerville, N.J.) is formed over the Cu metallic layer to first expose portions of the Cu metallic layer that do not overlie the first electrodes 210. The first exposed portions are wet etched (using an acetic acid/water/hydrogen peroxide mixture) to form a patterned protective layer 220. For an individual subpixel, the patterned protective layer 220 is 100 microns wide (measured in the same direction as the column width for the first electrodes 210). The AZ-9220™ resist is removed using a conventional technique. A substrate structure 130 is formed using AZ-4110™ resist material (Clariant Corp., Somerville, N.J.). The substrate structure 130 is patterned to form 90 micron wide subpixels 100 (measured in the same direction as the column width of the first electrodes 210) as measured between walls of the substrate structure 130. The substrate structure 130 is then cured by exposing to UV light and hard baking. A portion of the substrate structure 130 overlaps the patterned protective layer 220 and will form the undercut region 240. Second exposed portions of the first electrodes 210 lie along the bottoms of openings within the substrate structure 130. The second exposed portions of the Cu metallic layer are then removed using a wet etch (acetic acid/water/hydrogen peroxide), and undercut regions 240 are formed between the substrate structure 130 and first electrode 210 where the Cu metallic layer has been removed. Each undercut region 240 has a height of approximately 0.5 microns and a depth of approximately 5 microns.

Example 2

Example 2 demonstrates that the method described in Example 1 can be modified to include a surface treatment while the patterned protective layer 220 overlies the first electrode 210.

The method of Example 1 is repeated for an active matrix substrate containing electronic components. The method is as previously described through the formation of the substrate structure 130 and before removal of the second exposed portions of the Cu metallic layer. The substrate structure is then surface treated using a $CF_4$ plasma. A capacitively coupled March PX-500 (March Plasma Systems, Concord, Calif.) can be used, operating in a downstream mode at approximately 300 mTorr and 400 Watts RF power. A gas mixture of 8% $O_2$ and 92% $CF_4$ can be used for approximately 3 minutes, followed by removal of the second exposed portions of the Cu metallic layer using a wet etch. The resulting fluorinated substrate structure surface gives contact angles, for many water and solvent based solutions, of greater than 80 degrees (determined using a VCA-3000 Wafer Surface Analysis System from AST Products, Inc., Billerica, Mass.). After removal of the second exposed portions of the Cu metallic layer, no damage to the underlying electronic components is observed.

Example 3

Example 3 demonstrates that the method described in Example 2 can be extended to form organic layers in an organic electronic device. A charge transport layer of a hole-injection material (BAYTRON-P, Bayer AG, Germany) is formed by ink-jet depositing using a Litrex 80L Industrial Ink Jet Technology System (Litrex Corp., Pleasanton, Calif.) with a Spectra SE-Special printhead (Spectra, Inc., Lebanon, N.H.). An organic active layer is then formed over the charge transport layer by ink-jet depositing a green light-emitting polymer (e.g. a Green 1300 Series polyfluorene, Dow Chemical Co., Midland, Mich.) in a 1% weight/volume solution with 3,4-dimethylanisole. Other than at or near the undercut regions 240, the organic layers uniformly coat the pixels to a thickness of about 100 to 200 nm of hole-injection material and 70-80 nm of light-emitting polymer. A completed device can be made by depositing a second electrode (a cathode) of 3 nm of Ba followed by 300 nm of Al and encapsulating using a standard epoxy resin.

Example 4

Example 4 demonstrates that the patterned protective layer can include a plurality of metallic layers.

A patterned protective layer 220 that includes two metallic layers can be made by the method of Example 1 by sequentially sputter depositing a first metallic layer of Mo and a second metallic layer of Cu. The thicknesses of the Mo and Cu layers are 20 nm and 480 nm, respectively. The two metallic layers are then photo-patterned using an Ultraline 7000 Series Mask Aligner (QUINTEL Corp., San Jose, Calif.), before the substrate structure is deposited. The thin Mo layer improves the adhesion of the patterned protective layer 220 to the first electrode 210. The wet etch (acetic acid/water/hydrogen peroxide) as described with respect to Example 1 also etches the thin Mo layer.

Example 5

Example 5 demonstrates that residual portions of the patterned protective layer can remain after second portions are etched. Such residual portions improve the performance of the electronic device without any significant adverse affects.

A patterned protective layer is formed using the method of Example 1 by modifying the patterning of the Cu metallic layer and also the later removal process for the patterned protective layer. The Cu metallic layer is patterned such that the patterned protective layer 320 is 110 to 130 microns wide (measured in the same direction as the column width of the first electrodes). The substrate structure 130 includes openings 100 microns wide that correspond to the individual sub-pixels 100. After forming the substrate structure 130 over the patterned protective layer 320, the removal, by wet etching, of the patterned protective layer 320 is carefully controlled by varying the etch chemistry and etch time, so that residual portions 3201 of the patterned protective layer 320 are not removed. The undercut region 240 is formed with a height of 0.5 microns and a depth of 1 to 4 microns. The residual portions 3201 remain in contact with both the first electrodes (anodes) and at least one subsequently formed organic layer. Since Cu is a metal with both high thermal conductivity and high electrical conductivity, it can not only improve heat dissipation in the device, but also reduce the electrical resistance along the length of the first electrodes 210.

Note that not all of the activities described above in the general description or the examples are required, that a portion of a specific activity may not be required, and that further activities may be performed in addition to those described. Still further, the order in which each of the activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense and all such modifications are intended to be included within the scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. An electronic device comprising:
   a substrate having an undercut region;
   a first electrode over the substrate;
   a patterned protective layer over the first electrode, said patterned protective layer comprising a first metallic layer and a second metallic layer, the first metallic layer being in contact with both the first electrode and the second metallic layer;
   a substrate structure over the patterned protective layer, having an opening, wherein at least a portion of the opening within the substrate overlies an exposed portion of the patterned protective layer;
   a solid layer within the undercut region;
   at least one organic layer; and
   a second electrode over the at least one organic layer;
   wherein the electronic device further comprises an organic electronic component, the organic electronic component comprising the first electrode, the at least one organic layer, and the second electrode.

2. The electronic device of claim 1, wherein the undercut region has a height of 0.4 microns to 1 micron and a depth of 0.5 microns to 10 microns.

3. The electronic device of claim 1, wherein the patterned protective layer lies immediately adjacent to the undercut region and along a sidewall of the first electrode.

4. The electronic device of claim 1, wherein the patterned protective layer comprises at least one element within Group 4, 5, 6, 8, 10, 11, 12, 13 or 14 of the Periodic Table, or any combination thereof.

5. The electronic device of claim 1, wherein the patterned protective layer comprises at least one element comprising Cu, Al, Ag, Au, Mo, Cr, Ti, Ta, W, Si, or any combination thereof.

6. The electronic device of claim 1, wherein the patterned protective layer comprises a silicon-containing molecule.

7. The electronic device of claim 1, wherein the patterned protective layer comprising an organic material.

8. The electronic device of claim 1, wherein the at least one organic layer comprises an organic active layer.

* * * * *